(12) United States Patent
Kageyama

(10) Patent No.: US 8,395,236 B2
(45) Date of Patent: Mar. 12, 2013

(54) MIM CAPACITOR STRUCTURE HAVING PENETRATING VIAS

(75) Inventor: Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/038,415

(22) Filed: Mar. 2, 2011

(65) Prior Publication Data

US 2011/0147890 A1 Jun. 23, 2011

Related U.S. Application Data

(63) Continuation of application No. 12/257,470, filed on Oct. 24, 2008, now Pat. No. 7,906,832.

(30) Foreign Application Priority Data

Oct. 26, 2007 (JP) ................. 2007-278945

(51) Int. Cl.
*H01L 21/02* (2006.01)

(52) U.S. Cl. ........ 257/532; 257/301; 257/306; 257/379; 438/396

(58) Field of Classification Search ............... 257/301, 257/306, 379, 532, 59; 438/396

See application file for complete search history.

(56) References Cited

U.S. PATENT DOCUMENTS

| | | | |
|---|---|---|---|
| 5,583,359 A | 12/1996 | Ng et al. | |
| 5,760,429 A | 6/1998 | Yano et al. | |
| 6,022,804 A | 2/2000 | Yano et al. | |
| 6,710,425 B2 | 3/2004 | Bothra | |
| 7,041,569 B1 | 5/2006 | Kar-Roy et al. | |
| 2004/0169255 A1* | 9/2004 | Kiyotoshi | 257/532 |
| 2005/0263848 A1 | 12/2005 | Cho | |
| 2006/0138595 A1 | 6/2006 | Kiyotoshi | |

FOREIGN PATENT DOCUMENTS

| | | |
|---|---|---|
| JP | 63-065663 A | 3/1988 |
| JP | 03-257855 A | 11/1991 |
| JP | 07-099245 A | 4/1995 |
| JP | 2003-258107 | 9/2003 |
| JP | 2004-200640 A | 7/2004 |

* cited by examiner

*Primary Examiner* — Kimberly Rizkallah
*Assistant Examiner* — Errol Fernandes
(74) *Attorney, Agent, or Firm* — Rabin & Berdo, P.C.

(57) ABSTRACT

The semiconductor device according to the present invention includes a plurality of capacitance elements. Each capacitance element has a structure obtained by holding a capacitance film made of an insulating material between first and second electrodes made of a metallic material. The first and second electrodes are so arranged as to partially overlap each other while relatively positionally deviating from each other in a direction orthogonal to the opposed direction thereof. The plurality of capacitance elements are stacked in the opposed direction.

21 Claims, 2 Drawing Sheets

MIM CAPACITOR STRUCTURE HAVING PENETRATING VIAS

BACKGROUND OF THE INVENTION

1. Field of the Invention

The present invention relates to a semiconductor device including a capacitance element having an MIM (Metal-Insulator-Metal) structure.

2. Description of Related Art

A capacitance element (hereinafter referred to as "MIM capacitance element") having a structure (MIM structure) obtained by holding an insulating capacitance film between a lower electrode and an upper electrode is known as that constituting a system LSI for radio communication, for example.

FIG. 4 is a schematic sectional view showing the structure of a conventional MIM capacitance element. FIG. 4 partially omits hatching, in order to avoid complication of the illustration.

The MIM capacitance element 101 is provided on a semiconductor device based on a semiconductor substrate (not shown), for example. An interlayer dielectric film 102 is laminated on the semiconductor substrate. A trench 104 is formed on a surface layer portion of the interlayer dielectric film 102. A lower electrode 103 made of Cu (copper) is embedded in the trench 104. The surface of the lower electrode 103 is generally flush with that of the interlayer dielectric film 102. A capacitance film 105 made of SiN (silicon nitride), for example, is formed on the surfaces of the interlayer dielectric film 102 and the lower electrode 103. An upper electrode 106 made of TiN (titanium nitride), for example, is provided on the capacitance film 105. The upper electrode 106 is in the form of a flat plate smaller in size than the lower electrode 103 in plan view, and opposed to the lower electrode 103 through the capacitance film 105.

Another interlayer dielectric film 107 is laminated on the capacitance film 105 and the upper electrode 106. A lower electrode contact plug 108 and an upper electrode contact plug 109 are provided in the interlayer dielectric film 107, to penetrate through the same in the thickness direction respectively. The lower electrode contact plug 108 further penetrates through the capacitance film 105, so that the lower end thereof is connected to the lower electrode 103. The lower end of the upper electrode contact plug 109 is connected to the upper electrode 106.

The capacitance of the MIM capacitance element 101 is proportional to the opposed area of the lower electrode 103 and the upper electrode 106. In an IC chip (semiconductor device) loaded with the MIM capacitance element 101, therefore, reduction of the chip size is hindered due to a large area occupied by the MIM capacitance element.

SUMMARY OF THE INVENTION

An object of the present invention is to provide a semiconductor device capable of increasing the capacitance density (capacitance per unit occupied area) of a capacitance element having an MIM structure thereby reducing the area occupied by the capacitance element.

A semiconductor device according to one aspect of the present invention includes a plurality of capacitance elements. Each capacitance element has a structure obtained by holding a capacitance film made of an insulating material between first and second electrodes made of a metallic material. The first and second electrodes are so arranged as to partially overlap each other while relatively positionally deviating from each other in a direction orthogonal to the opposed direction thereof. The plurality of capacitance elements are stacked in the opposed direction.

The plurality of capacitance elements are so stacked that the composite capacitance (sum of the capacitances of the capacitance elements) thereof can be increased without increasing the areas occupied by the capacitance elements in the semiconductor device. Consequently, the capacitance densities of the capacitance elements can be increased. Therefore, the areas occupied by the capacitance elements can be reduced without reducing the capacitances thereof.

An interlayer dielectric film made of an insulating material may be interposed between the capacitance elements.

Preferably, the first electrodes are formed on the same position in the same shape in plan view, and the second electrodes are formed on the same position in the same shape in plan view in this case.

The first electrodes are so formed on the same position in the same shape in plan view that the same can be formed through a common photomask. The second electrodes are also so formed on the same position in the same shape in plan view that the same can be formed through a common photomask. Consequently, the first and second electrodes can be formed through single photomasks respectively, whereby the cost for manufacturing the semiconductor device can be reduced.

Further, portions of the first electrodes not overlapping the second electrodes in plan view are formed on the same position in plan view. Therefore, a first via penetrating through the interlayer dielectric film can be connected in common to the portions of the first electrodes not overlapping the second electrodes in plan view. Thus, the first via can be connected to the first electrodes in a simpler structure as compared with a structure of individually connecting the first via to each first electrode.

In addition, portions of the second electrodes not overlapping the first electrodes in plan view are formed on the same position in plan view. Therefore, a second via penetrating through the interlayer dielectric film can be connected in common to the portions of the second electrodes not overlapping the first electrodes in plan view. Thus, the second via can be connected to the second electrodes in a simpler structure as compared with a structure of individually connecting the second via to each second electrode.

The capacitance film may be interposed between the second electrode constituting a first one of the capacitance elements and the first electrode constituting a second one of the capacitance elements stacked on the first capacitance element. The second electrode constituting the first capacitance element constitutes the second capacitance element stacked on the first capacitance element along with the first electrode stacked on this second electrode through the capacitance film. That is, the second electrode is shared by the two capacitance elements adjacent to each other in the stacking direction. When three or more capacitance elements are stacked, the first electrode constituting the second capacitance element constitutes the capacitance element stacked on the second capacitance element along with the second electrode stacked on this first electrode through the capacitance film. That is, the first electrode is shared by the two capacitance elements adjacent to each other in the stacking direction. Thus, the first electrode and/or the second electrode is so shared by the two capacitance elements that the structure formed by stacking the plurality of capacitance elements can be obtained while suppressing increase in the thickness of the semiconductor device.

Preferably, the first electrodes are formed on the same position in the same shape in plan view in this structure.

The first electrodes are so formed on the same position in the same shape in plan view that the same can be formed through a common photomask. Consequently, the first electrodes can be formed through a single photomask, whereby the cost for manufacturing the semiconductor device can be reduced.

Further, portions of the first electrodes not overlapping the second electrodes in plan view are formed on the same position in plan view. Therefore, the first via penetrating through the interlayer dielectric film can be connected in common to the portions of the first electrodes not overlapping the second electrodes in plan view. Thus, the first via can be connected to the first electrodes in a simpler structure as compared with the structure of individually connecting the first via to each first electrode.

In the structure having the first electrode and/or the second electrode shared by the two capacitance elements, the semiconductor device may include at least three capacitance elements. Preferably, the second electrodes are formed on the same position in the same shape in plan view in this case.

The second electrodes are so formed on the same position in the same shape in plan view that the same can be formed through a common photomask. Consequently, the second electrodes can be formed through a single photomask, whereby the cost for manufacturing the semiconductor device can be reduced.

Further, portions of the second electrodes not overlapping the first electrodes in plan view are formed on the same position in plan view. Therefore, the second via penetrating through the interlayer dielectric film can be connected in common to the portions of the second electrodes not overlapping the first electrodes in plan view. Thus, the second via can be connected to the second electrodes in a simpler structure as compared with the structure of individually connecting the second via to each second electrode.

The foregoing and other objects, features and effects of the present invention will become more apparent from the following detailed description of the embodiments with reference to the attached drawings.

DETAILED DESCRIPTION OF PREFERRED EMBODIMENTS

Embodiments of the present invention are now described in detail with reference to the attached drawings.

Figure 1:
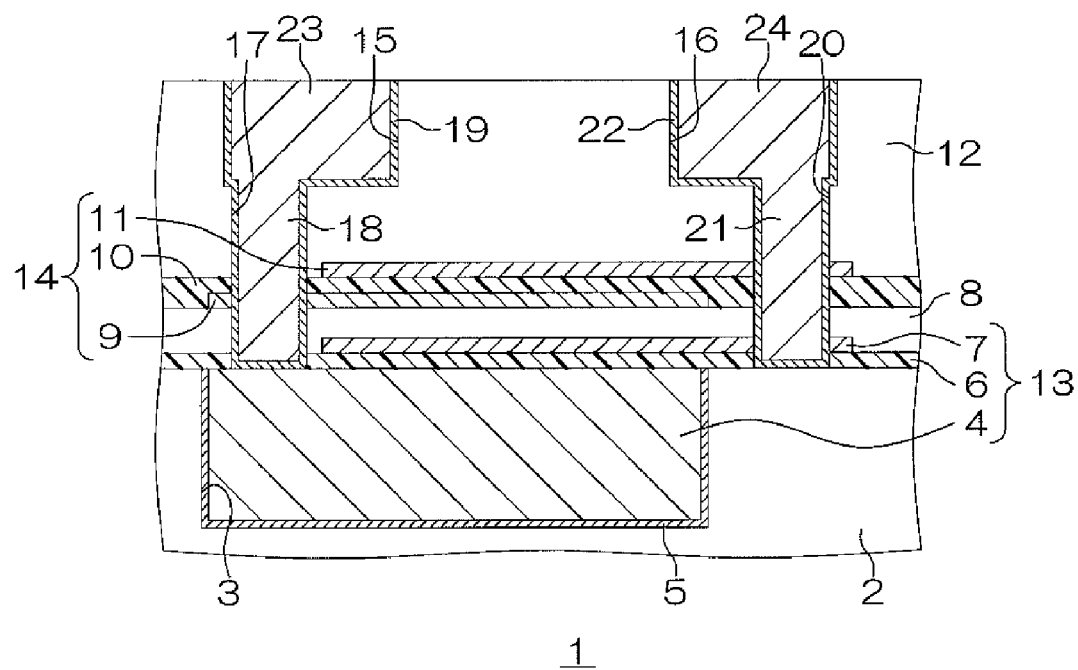
FIG. 1 is a schematic sectional view showing the structure of a semiconductor device according to a first embodiment of the present invention.

FIG. 1 is a schematic sectional view showing the structure of a semiconductor device according to a first embodiment of the present invention.

A semiconductor device 1 includes a semiconductor substrate (not shown). The semiconductor substrate is an Si (silicon) substrate, for example. Elements such as MOSFET (Metal Oxide Semiconductor Field-Effect Transistor) are provided on a surface layer portion of the semiconductor substrate.

A first interlayer dielectric film 2 made of $SiO_2$ (silicon oxide) is formed on the semiconductor substrate.

A first trench 3 quadrangular in plan view is formed on the first interlayer dielectric film 2. The first trench 3 is dug in the first interlayer dielectric film 2 from the upper surface thereof. A first lower electrode 4 made of Cu is embedded in the first trench 3 through a barrier film 5. More specifically, the inner surfaces of the first trench 3 are covered with the barrier film 5 made of a metallic material (Ta, TaN (tantalum nitride) or $Mn_xSi_yO_z$ (x, y and z: numerals greater than zero), for example) having barrier properties against diffusion of Cu. The first lower electrode 4 having a surface generally flush with that of the first interlayer dielectric film 2 is embedded in the first trench 3 by filling up the inner side of the barrier film 5 with Cu.

A first capacitance film 6 made of an insulating material (SiN, SiOC (carbon-doped silicon oxide) or SiOF (fluorine-doped silicon oxide), for example) is formed on the first interlayer dielectric film 2 and the first lower electrode 4, to cover the overall regions thereof.

A first upper electrode 7 made of TiN (titanium nitride) is formed on the first capacitance film 6. The first upper electrode 7 has a quadrangular shape in plan view, and is so arranged as to partially overlap the first lower electrode 4 in plan view while relatively positionally deviating therefrom in a direction (parallel to the surface of the first interlayer dielectric film 2) orthogonal to that opposed to the first lower electrode 4. Thus, the semiconductor device 1 includes a first MIM capacitance element 13 having a structure obtained by holding the first capacitance film 6 between the first lower and upper electrodes 4 and 7.

The first upper electrode 7 is formed by forming a TiN film on the first capacitance film 6 and patterning the same, for example. More specifically, the TiN film is formed on the first capacitance film 6, and a resist pattern is thereafter formed on this TiN film through a prescribed photomask. Then, the first upper electrode 7 is formed by etching the TiN film through the resist pattern serving as a mask.

A second interlayer dielectric film 8 made of $SiO_2$ is formed on the first capacitance film 6 and the first upper electrode 7.

A second lower electrode 9 made of TiN is formed on the second interlayer dielectric film 8. The second lower electrode 9 has the same shape as the first lower electrode 4 and is arranged on the same position as the first lower electrode 4 in plan view.

The second lower electrode 9 is formed by forming a TiN film on the second interlayer dielectric film 8 and patterning the same, for example. More specifically, the TiN film is formed on the second interlayer dielectric film 8, and a resist pattern is thereafter formed on this TiN film through a prescribed photomask. Then, the second lower electrode 9 is formed by etching the TiN film through the resist pattern serving as a mask.

A second capacitance film 10 is formed on the second interlayer dielectric film 8 and the second lower electrode 9. The second capacitance film 10 can be made of the same material as the first capacitance film 6.

A second upper electrode 11 made of TiN is formed on the second capacitance film 10. The second upper electrode 11 has the same shape as the first upper electrode 7 and is arranged on the same position as the first upper electrode 7 in plan view. Thus, the semiconductor device 1 includes a second MIM capacitance element 14 having a structure obtained by holding the second capacitance film 10 between the second lower and upper electrodes 9 and 11.

The second upper electrode 11 is formed by forming a TiN film on the second capacitance film 10 and patterning the same, for example. More specifically, the TiN film is formed on the second capacitance film 10, and a resist pattern is thereafter formed on this TiN film through the photomask employed for forming the first upper electrode 7. Then, the second upper electrode 11 is formed by etching the TiN film through the resist pattern serving as a mask.

A third interlayer dielectric film 12 made of $SiO_2$ is formed on the second capacitance film 10 and the second upper electrode 11.

The third interlayer dielectric film 12 is provided with a second trench 15 dug from the surface thereof and a via hole 17 extending from the bottom surface of the second trench 15 toward the first lower electrode 4. The via hole 17 penetrates through the third interlayer dielectric film 12 on a side of the second upper electrode 11 and further penetrates through the second capacitance film 10, the second lower electrode 9, the second interlayer dielectric film 8 and the first capacitance film 6, to reach the first lower electrode 4.

The inner surfaces of the second trench 15 and the via hole 17 are covered with a barrier film 19 made of a metallic material having barrier properties against diffusion of Cu. The inner side of the barrier film 19 is filled up with Cu, to integrally form a first wire 23 embedded in the second trench 15 and a first via 18 embedded in the via hole 17.

Thus, the first via 18 penetrates through a portion of the second lower electrode 9 not overlapping the second upper electrode 11 in plan view, so that the lower end thereof is connected to the first lower electrode 4 through the barrier film 19. The first wire 23 is electrically connected with the first and second lower electrodes 4 and 9 through the first via 18.

The third interlayer dielectric film 12 is further provided with a third trench 16 dug from the surface thereof and a via hole 20 extending from the bottom surface of the third trench 16 toward the first interlayer dielectric film 2. The via hole 20 penetrates through the third interlayer dielectric film 12 on a side of the second lower electrode 9 and further penetrates through the second upper electrode 11, the second capacitance film 10, the second interlayer dielectric film 8, the first upper electrode 7 and the first capacitance film 6, to reach the first interlayer dielectric film 2.

The inner surfaces of the third trench 16 and the via hole 20 are covered with a barrier film 22 made of the same material as the barrier film 19. The inner side of the barrier film 22 is filled up with Cu, to integrally form a second wire 24 embedded in the third trench 16 and a second via 21 embedded in the via hole 20.

Thus, the second via 21 penetrates through a portion of the second upper electrode 11 not overlapping the second lower electrode 9 in plan view, so that the lower end thereof is connected to the first upper electrode 7 through the barrier film 22. Therefore, the second wire 24 is electrically connected with the first and second upper electrodes 7 and 11 through the second via 21.

As hereinabove described, the semiconductor device 1 includes the first and second MIM capacitance elements 13 and 14. The first MIM capacitance element 13 has the structure obtained by holding the first capacitance film 6 between the first lower and upper electrodes 4 and 7. The first lower and upper electrodes 4 and 7 are so arranged as to partially overlap each other in plan view while relatively positionally deviating from each other in the direction orthogonal to the opposed direction thereof. The second MIM capacitance element 14 has the structure obtained by holding the second capacitance film 10 between the second lower and upper electrodes 9 and 11. The second lower and upper electrodes 9 and 11 are so arranged as to partially overlap each other in plan view while relatively positionally deviating from each other in the direction orthogonal to the opposed direction thereof. The first and second MIM capacitance elements 13 and 14 are stacked in the opposed direction.

The first and second MIM capacitance elements 13 and 14 are so stacked that the composite capacitance (sum of the capacitances of the first and second MIM capacitance elements 13 and 14) thereof can be increased without increasing the areas occupied by the first and second MIM capacitance elements 13 and 14 as compared with a structure obtained by laterally arranging the first and second MIM capacitance elements 13 and 14. In other words, the composite capacitance density corresponding to the composite capacitance per unit occupied area can be increased, and the areas occupied by the first and second MIM capacitance elements 13 and 14 can be reduced without reducing the composite capacitance.

The first and second upper electrodes 7 and 11 are so formed on the same position in the same shape in plan view that these electrodes 7 and 11 can be formed through the common photomask. Consequently, the first and second upper electrodes 7 and 11 can be formed through a single photomask, whereby the cost for manufacturing the semiconductor device 1 can be reduced.

A portion of the first lower electrode 4 not overlapping the first upper electrode 7 in plan view and the portion of the second lower electrode 9 not overlapping the second upper electrode 11 in plan view are formed on the same position in plan view. Therefore, the first via 18 can be connected in common to the portions of the first and second lower electrodes 4 and 9 not overlapping the first and second upper electrodes 7 and 11 in plan view respectively. Thus, the first via 18 can be connected to the first and second lower electrodes 4 and 9 in a simpler structure as compared with a structure of individually connecting the first via 18 to each of the first and second lower electrodes 4 and 9.

Further, a portion of the first upper electrode 7 not overlapping the first lower electrode 4 in plan view and the portion of the second upper electrode 11 not overlapping the second lower electrode 9 in plan view are formed on the same position in plan view. Therefore, the second via 21 can be connected in common to the portions of the first and second upper electrodes 7 and 11 not overlapping the first and second lower electrodes 4 and 9 in plan view respectively. Thus, the second via 21 can be connected to the first and second upper electrodes 7 and 11 in a simpler structure as compared with a structure of individually connecting the second via 21 to each of the first and second upper electrodes 7 and 11.

The first lower electrodes 4 and 54, the first wires 23 and 71, the second wires 24 and 72, the first vias 18 and 66 and the second vias 21 and 69 made of Cu in this embodiment may alternatively be made of a metallic material containing Cu as the main component.

In the semiconductor device 1, the first lower electrode 4 may be made of a metallic material containing Al. In this case, the first interlayer dielectric film 2 may not be provided with the first trench 3, but the first lower electrode 4 may be formed on a generally planar surface of the first interlayer dielectric film 3. When the first lower electrode 4 is made of the metallic material containing Al, the first and second lower electrodes 4 and 9 are preferably arranged on the same position in the same shape in plan view. Thus, the first lower electrode 4 can be formed through the photomask employed for forming the second upper electrode 9. Therefore, the first and second lower electrodes 4 and 9 can be formed through a single photomask, whereby the cost for manufacturing the semiconductor device 1 can be reduced. In this case, the first upper electrode 7, the second lower electrode 9 and the second upper electrode 11 may also be made of the metallic material containing Al, while the first and second vias 18 and 21 and the first and second wires 23 and 24 may be made of a metallic material containing W (tungsten).

While the two MIM capacitance elements, i.e., the first and second MIM capacitance elements 13 and 14 are stacked on the semiconductor device 1, three or more MIM capacitance elements may alternatively be stacked. In this case, lower electrodes in each MIM capacitance element are preferably formed on the same position in the same shape in plan view through a common photomask. Further, upper electrodes in each MIM capacitance element are also preferably formed on the same position in the same shape in plan view through a common photomask. Thus, the upper and lower electrodes can be formed through single photomasks respectively, whereby the cost for manufacturing the semiconductor device can be reduced.

The lower electrodes are formed through the common photomask while the upper electrodes are also formed through the common photomask, whereby portions of the lower electrodes not overlapping the upper electrodes in plan view can be formed on the same position in plan view and portions of the upper electrodes not overlapping the lower electrodes in plan view can also be formed on the same position in plan view. Therefore, the first via 18 penetrating through the third interlayer dielectric film 12 is so connected in common to portions of the first electrodes not overlapping the second electrodes in plan view that the first via 18 can be connected to the lower electrodes in a simpler structure as compared with a structure of individually connecting the first via 18 to each of lower electrode. Further, the second via 21 penetrating through the third interlayer dielectric film 12 is so connected in common to the portions of the upper electrodes not overlapping the lower electrodes in plan view that the second via 21 can be connected to the upper electrodes in a simpler structure as compared with a structure of individually connecting the second via 21 to each upper electrode.

Figure 2:
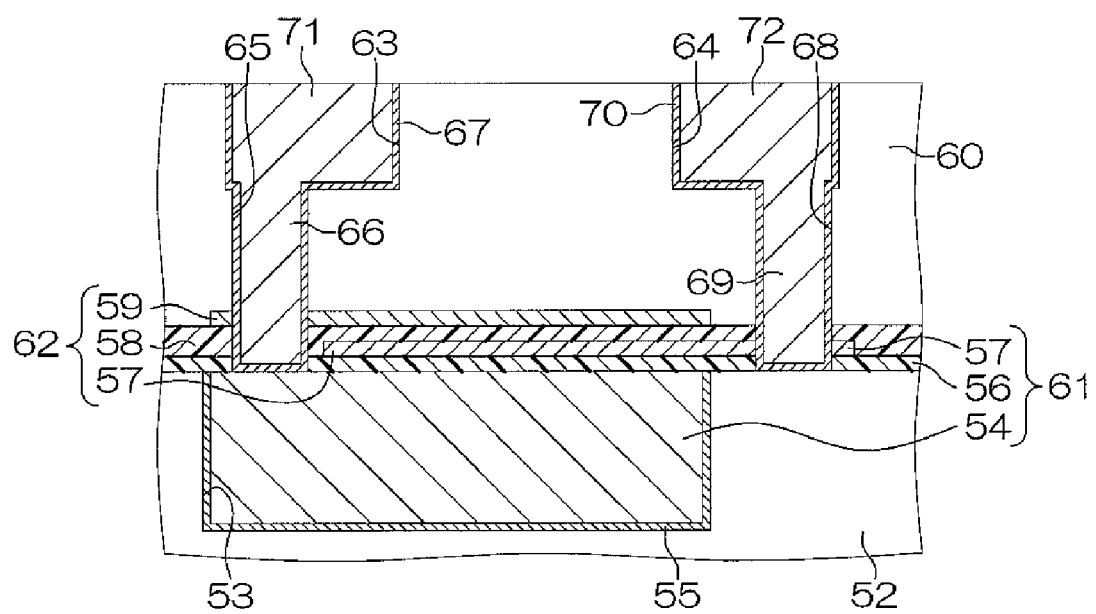
FIG. 2 is a schematic sectional view showing the structure of a semiconductor device according to a second embodiment of the present invention.

FIG. 2 is a schematic sectional view showing the structure of a semiconductor device according to a second embodiment of the present invention.

A semiconductor device 51 includes a semiconductor substrate (not shown). The semiconductor substrate is an Si substrate, for example. Elements such as MOSFET are provided on the surface layer portion of the semiconductor substrate.

A first interlayer dielectric film 52 made of $SiO_2$ is formed on the semiconductor substrate.

A first trench 53 quadrangular in plan view is formed on the first interlayer dielectric film 52. The first trench 53 is dug in the first interlayer dielectric film 52 from the upper surface thereof. A lower electrode 54 made of Cu is embedded in the first trench 53 through a barrier film 55. More specifically, the inner surfaces of the first trench 53 are covered with the barrier film 55 made of a metallic material (Ta, TaN or $Mn_x Si_y O_z$ (x, y and z: numerals greater than zero), for example) having barrier properties against diffusion of Cu. The lower electrode 54 having a surface generally flush with that of the first interlayer dielectric film 52 is embedded in the first trench 53 by filling up the inner side of the barrier film 55 with Cu.

A first capacitance film 56 made of an insulating material (SiN, SiOC or SiOF, for example) is formed on the first interlayer dielectric film 52 and the lower electrode 54, to cover the overall regions thereof.

An intermediate electrode 57 made of TiN is formed on the first capacitance film 56. The intermediate electrode 57 has a quadrangular shape in plan view, and is so arranged as to partially overlap the lower electrode 54 in plan view while relatively positionally deviating therefrom in a direction (parallel to the surface of the first interlayer dielectric film 52) orthogonal to that opposed to the lower electrode 54. Thus, the semiconductor device 51 includes a first MIM capacitance element 61 having a structure obtained by holding the first capacitance film 56 between the lower electrode 54 and the intermediate electrode 57.

The intermediate electrode 57 is formed by forming a TiN film on the first capacitance film 56 and patterning the same, for example. More specifically, the TiN film is formed on the first capacitance film 56, and a resist pattern is thereafter formed on this TiN film through a prescribed photomask. Then, the intermediate electrode 57 is formed by etching the TiN film through the resist pattern serving as a mask.

A second capacitance film 58 made of an insulating material is formed on the first capacitance film 56 and the intermediate electrode 57. The second capacitance film 58 can be made of the same material as the first capacitance film 56.

An upper electrode 59 made of TiN is formed on the second capacitance film 58. The upper electrode 59 has the same shape as the lower electrode 54 and is arranged on the same position as the lower electrode 54 in plan view. Thus, the semiconductor device 51 includes a second MIM capacitance element 62 having a structure obtained by holding the second capacitance film 58 between the intermediate electrode 57 and the upper electrode 59.

The upper electrode 59 is formed by forming a TiN film on the second capacitance film 58 and patterning the same, for example. More specifically, the TiN film is formed on the second capacitance film 58, and a resist pattern is thereafter formed on this TiN film through a prescribed photomask. Then, the upper electrode 59 is formed by etching the TiN film through the resist pattern serving as a mask.

A second interlayer dielectric film 60 made of $SiO_2$ is formed on the second capacitance film 58 and the upper electrode 59.

The second interlayer dielectric film 60 is provided with a second trench 63 dug from the surface thereof and a via hole 65 extending from the bottom surface of the second trench 63 toward the lower electrode 65. The via hole 65 penetrates through the second interlayer dielectric film 60 on a side of the intermediate electrode 57 and further penetrates through the upper electrode 59, the second capacitance film 58 and the first capacitance film 56, to reach the lower electrode 54.

The inner surfaces of the second trench 63 and the via hole 65 are covered with a barrier film 67 made of a metallic material having barrier properties against diffusion of Cu. The inner side of the barrier film 67 is filled up with Cu, to integrally form a first wire 71 embedded in the second trench 63 and a first via 66 embedded in the via hole 65.

Thus, the first via 66 penetrates through a portion of the upper electrode 59 not overlapping the intermediate electrode 57 in plan view, so that the lower end thereof is connected to the lower electrode 54 through the barrier film 67. The first wire 71 is electrically connected with the lower and upper electrodes 54 and 59 through the first via 66.

The second interlayer dielectric film 60 is provided with a third trench 64 dug from the surface thereof and a via hole 68 extending from the bottom surface of the third trench 64 toward the first interlayer dielectric film 52. The via hole 58 penetrates through the second interlayer dielectric film 60 on a side of the upper electrode 59 and further penetrates through the second capacitance film 58, the intermediate electrode 57 and the first capacitance film 56, to reach the first interlayer dielectric film 52.

The inner surfaces of the third trench 64 and the via hole 68 are covered with a barrier film 70 made of the same material as the barrier film 67. The inner side of the barrier film 70 is filled up with Cu, to integrally form a second wire 72 embedded in the third trench 64 and a second via 69 embedded in the via hole 68.

Thus, the second via 69 penetrates through a portion of the intermediate electrode 57 not overlapping the lower electrode 54 in plan view. The second wire 72 is electrically connected with the interlayer electrode 57 through the second via 69.

As hereinabove described, the first and second MIM capacitance elements 61 and 62 are stacked in the semiconductor device 51. Thus, the composite capacitance (sum of the capacitances of the first and second MIM capacitance elements 61 and 62) thereof can be increased without increasing the areas occupied by the first and second MIM capacitance elements 61 and 62, similarly to the semiconductor device 1 (see FIG. 1). In other words, the composite capacitance density corresponding to the composite capacitance per unit occupied area can be increased, and the areas occupied by the first and second MIM capacitance elements 61 and 62 can be reduced without reducing the composite capacitance.

The intermediate electrode 57 constituting the first MIM capacitance element 61 also constitutes the second MIM capacitance element 62 on the first MIM capacitance element 61, along with the upper electrode 59 stacked on the intermediate electrode 57 through the second capacitance film 58 interposed therebetween. That is, the intermediate electrode 57 is shared by the first and second MIM capacitance elements 61 and 62 adjacent to each other in the stacking direction. Thus, the two MIM capacitance elements 61 and 62 so share the intermediate electrode 57 that the first and second MIM capacitance elements 61 and 62 can be stacked while suppressing increase in the thickness of the semiconductor device 51.

A portion of the lower electrode 54 not overlapping the intermediate electrode 57 in plan view and the portion of the upper electrode 59 not overlapping the intermediate electrode 57 in plan view are formed on the same position in plan view. Therefore, the first via 66 penetrating through the second interlayer dielectric film 60 is so connected in common to the portions of the lower and upper electrodes 54 and 59 not overlapping the intermediate electrode 57 in plan view that the first via 66 can be connected to the lower and upper electrodes 54 and 59 in a simpler structure as compared with a structure of individually connecting the first via 66 to each of the lower and upper electrodes 54 and 59.

The lower electrode 54 made of Cu in this embodiment may alternatively be made of a metallic material containing Al. In this case, the first interlayer dielectric film 52 may not be provided with the first trench 53, but the lower electrode 54 may be formed on a generally planar surface of the first interlayer dielectric film 53. When the lower electrode 54 is made of the metallic material containing Al, the lower and upper electrodes 54 and 59 are preferably arranged on the same position in the same shape in plan view. Thus, the lower electrode 54 can be formed through the photomask employed for forming the upper electrode 59. Therefore, the lower and upper electrodes 54 and 59 can be formed through a single photomask, whereby the cost for manufacturing the semiconductor device 51 can be reduced. In this case, the intermediate electrode 57 and the upper electrode 59 may also be made of the metallic material containing Al, while the first and second vias 66 and 69 and the first and second wires 71 and 72 may be made of a metallic material containing W.

While the two MIM capacitance elements, i.e., the first and second MIM capacitance elements 61 and 62 are stacked on the semiconductor device 51, three or more MIM capacitance elements may alternatively be stacked.

Figure 3:
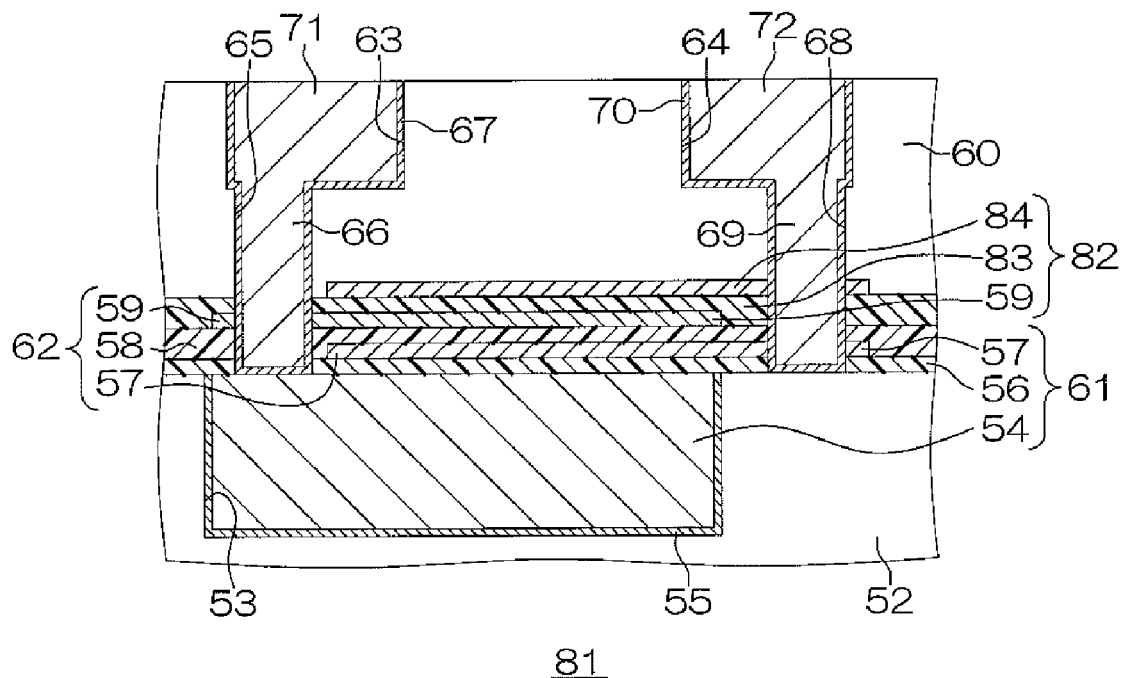
FIG. 3 is a schematic sectional view showing the structure of a semiconductor device according to a third embodiment of the present invention.
Figure 4:
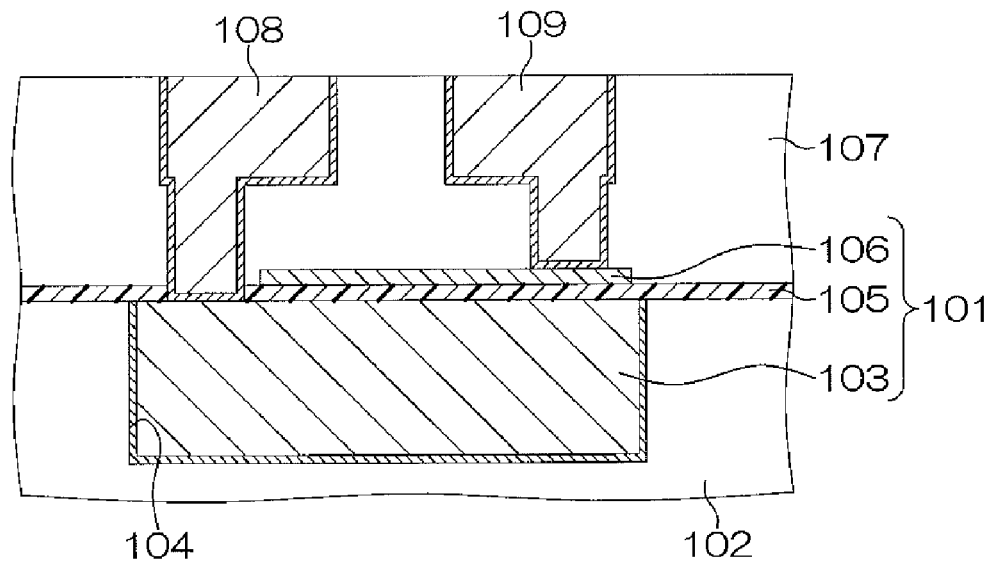
FIG. 4 is a schematic sectional view showing the structure of a conventional semiconductor device.

FIG. 3 is a schematic sectional view showing the structure of a semiconductor device according to a third embodiment of the present invention. Referring to FIG. 3, portions corresponding to those shown in FIG. 2 are denoted by the same reference numerals. In the following, only portions different from those in the structure shown in FIG. 2 are described, and redundant description is omitted as to the portions denoted by the same reference numerals as those in FIG. 2.

The semiconductor device 81 shown in FIG. 3 includes a third MIM capacitance element 82, in addition to first and second MIM capacitance elements 61 and 62.

That is, a third capacitance film 83 made of an insulating material is formed on a second capacitance film 58 and an intermediate electrode 59 corresponding to the upper electrode 59 shown in FIG. 2. The third capacitance film 83 can be made of the same material as a first capacitance film 56 and the second capacitance film 58.

An upper electrode 84 made of TiN is formed on the third capacitance film 83. The upper electrode 84 has the same shape as another intermediate electrode 57 and is arranged on the same position as the intermediate electrode 57 in plan view. Thus, the semiconductor device 81 includes the third MIM capacitance element 82 having a structure obtained by holding the third capacitance film 83 between the intermediate electrode 59 and the upper electrode 84.

The upper electrode 84 is formed by forming a TiN film on the third capacitance film 83 and patterning the same, for example. More specifically, the TiN film is formed on the third capacitance film 83, and a resist pattern is thereafter formed on this TiN film through a prescribed photomask. Then, the upper electrode 84 is formed by etching the TiN film through the resist pattern serving as a mask.

A second interlayer dielectric film 60 made of $SiO_2$ is formed on the third capacitance film 58 and the upper electrode 59.

In the semiconductor device 81, a via hole 65 penetrates through the second interlayer dielectric film 60 on a side of the intermediate electrode 57 and the upper electrode 84 and further penetrates through the third capacitance film 83, the intermediate electrode 59, the second capacitance film 58 and a first capacitance film 56, to reach a lower electrode 54. Thus, a first via 66 penetrates through a portion of the intermediate electrode 59 not overlapping the intermediate electrode 57 in plan view, so that the lower end thereof is connected to the lower electrode 54 through a barrier film 67. Therefore, a first wire 71 is electrically connected with the lower electrode 54 and the intermediate electrode 59 through the first via 66.

In the semiconductor device 81, further, another via hole 68 penetrates through the second interlayer dielectric film 60 on a side of the intermediate electrode 59 and further penetrates through the upper electrode 84, the third capacitance film 83, the second capacitance film 58, the intermediate electrode 57 and the first capacitance film 56, to reach a first interlayer dielectric film 52. Thus, a second via 69 penetrates through portions of the intermediate electrode 57 and the upper electrode 84 not overlapping the lower electrode 54 and the intermediate electrode 59 in plan view. A second wire 72 is electrically connected with the intermediate electrode 57 and the upper electrode 84 through the second via 69.

Thus, the electrodes (hereinafter referred to as "left electrodes") 54 and 59 formed on positions relatively leftwardly deviating in FIG. 3 are preferably formed on the same position in the same shape in plan view, while the electrodes (hereinafter referred to as "right electrodes") 57 and 84 formed on positions relatively rightwardly deviating in FIG. 3 are also preferably formed on the same position in the same shape in plan view. According to this structure, the left electrodes 54 and 59 can be formed through a common photomask, while the right electrodes 57 and 84 can also be formed through a common photomask. Consequently, the left electrodes 54 and 59 and the right electrodes 57 and 84 can be formed through single photomasks respectively, whereby the cost for manufacturing the semiconductor device 81 can be reduced.

Further, the left electrodes 54 and 59 are formed through the common photomask while the right electrodes 57 and 84 are also formed through the common photomask, whereby portions of the left electrodes 54 and 59 not overlapping the right electrodes 57 and 84 in plan view can be formed on the same position in plan view. Therefore, the first via 66 penetrating through the second interlayer dielectric film 60 is so connected in common to the portions of the left electrodes 54 and 59 not overlapping the right electrodes 57 and 84 in plan view that the first via 66 can be connected to the left electrodes 54 and 59 in a simpler structure as compared with a structure of individually connecting the first via 66 to each of the left electrodes 54 and 59. Further, the second via 69 penetrating through the second interlayer dielectric film 60 is so connected in common to the portions of the right electrodes 57 and 84 not overlapping the first electrodes 54 and 59 in plan view that the second via 69 can be connected to the right electrodes 57 and 84 in a simpler structure as compared with a structure of individually connecting the second via 69 to each of the right electrodes 57 and 84.

When the semiconductor device includes three or more MIM capacitance elements, therefore, left electrodes are preferably formed on the same position in the same shape in plan view, and right electrodes are also preferably formed on the same position in the same shape in plan view.

FIGS. 1 to 3 show parts (the first interlayer dielectric films 2 and 52, the second interlayer dielectric films 8 and 60 and the third interlayer dielectric films 12) of the semiconductor devices 1, 51 and 81 in an unhatched manner, in order to avoid complication of the illustrations.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-278945 filed with the Japan Patent Office on Oct. 26, 2007, the disclosure of which is incorporated herein by reference.

What is claimed is:

1. A semiconductor device comprising a plurality of capacitance elements, wherein:
    each of the capacitance elements has an MIM (Metal-Insulator-Metal) structure obtained by holding a capacitance film made of an insulating material between first and second electrodes made of a metallic material,
    the first and second electrodes are so arranged as to partially overlap each other in plan view while the second electrodes deviate in position from the first electrodes in plan view in a direction orthogonal to the direction in which the first and second electrodes oppose each other,
    the plurality of capacitance elements are stacked in the opposed direction, and
    a lowermost electrode of the first and second electrodes of the plurality of capacitance elements is made of a material that is different from the remaining electrodes of the first and second electrodes of the plurality of capacitance elements,
    an interlayer dielectric film made of an insulating material interposed between the capacitance elements,
    a first single via structure penetrating through the interlayer dielectric film and all first electrodes except the lowermost one of the first electrodes to be connected in common to portions of the first electrodes not overlapping the second electrodes in plan view, and
    a second single via structure penetrating through the interlayer dielectric film and all the second electrodes to be connected in common to portions of the second electrodes not overlapping the first electrodes in plan view.

2. The semiconductor device according to claim 1, wherein the first electrodes of said each of the capacitance elements are formed in a same shape in plan view, and
    the second electrodes of said each of the capacitance elements are formed in a same shape in plan view.

3. The semiconductor device according to claim 1, wherein the capacitance film is interposed between the second electrode constituting a first one of the capacitance elements and the first electrode constituting a second one of the capacitance elements stacked on the first capacitance element.

4. The semiconductor device according to claim 3, wherein the first electrodes are formed on the same position in the same shape in plan view.

5. The semiconductor device according to claim 4, further comprising the first via penetrating through the capacitance film to be connected in common to portions of the first electrodes not overlapping the second electrodes in plan view.

6. The semiconductor device according to claim 3, comprising at least three capacitance elements, wherein
    the second electrodes are formed on the same position in the same shape in plan view.

7. The semiconductor device according to claim 6, further comprising the second via penetrating through the capacitance film to be connected in common to portions of the second electrodes not overlapping the first electrodes in plan view.

8. The semiconductor device according to claim 1, wherein the lowermost electrode has a thickness greater than a thickness of any one of the remaining electrodes.

9. The semiconductor device according to claim 1, wherein the lowermost electrode has a first surface in contact with the capacitance film, and a second surface not in contact with the capacitance film, and
    the semiconductor device further comprises a barrier film covering the second surface.

10. The semiconductor device according to claim 1, wherein the first and second vias are made of the same material as the lowermost electrode.

11. The semiconductor device according to claim 5, wherein the first via is made of the same material as the lowermost electrode.

12. The semiconductor device according to claim 7, wherein the second via is made of the same material as the lowermost electrode.

13. The semiconductor device according to claim 1, wherein the first via and the second via respectively have a uniform thickness from one end thereof to the other end thereof.

14. The semiconductor device according to claim 5, wherein the first via has a uniform thickness from one end thereof to the other end thereof.

15. The semiconductor device according to claim 7, wherein the second via has a uniform thickness from one end thereof to the other end thereof.

16. The semiconductor device according to claim 1, wherein the first via and the second via are respectively covered with barrier films.

17. The semiconductor device according to claim 5, wherein the first via is covered with a barrier film.

18. The semiconductor device according to claim 7, wherein the second via is covered with a barrier film.

19. The semiconductor device according to claim 1, wherein the lowermost electrode is made of Cu, the first and second electrodes are made of TiN, and the capacitance film is made of SiN.

20. The semiconductor device according to claim 1, the second via extending from an uppermost one of the second electrodes to a lowermost one of the second electrodes.

21. The semiconductor device according to claim 1, the first via extending from an uppermost one of the first electrodes to a lowermost one of the first electrodes.

* * * * *